United States Patent
Tochizawa et al.

[11] Patent Number: 6,140,018
[45] Date of Patent: Oct. 31, 2000

[54] PHOTOSENSITIVE RESIN AND COMPOSITION THEREOF DERIVED FROM SAPONIFIED POLY(VINYL ACETATE) AND PATTERN FORMATION METHOD

[75] Inventors: Noriaki Tochizawa, Chiba; Mitsuharu Miyazaki, Ibaraki; Takaho Ito, Chiba, all of Japan

[73] Assignee: Toyo Gosei Kogyo Co., Ltd., Chiba, Japan

[21] Appl. No.: 09/368,835

[22] Filed: Aug. 5, 1999

[30] Foreign Application Priority Data

Aug. 5, 1998 [JP] Japan ................... 10-222113

[51] Int. Cl.[7] .............. G03C 1/73; G03C 1/74; G03F 7/09; G03F 7/30; G03F 7/20
[52] U.S. Cl. ............. 430/287.1; 430/909; 430/325; 525/58; 525/59; 525/61
[58] Field of Search ............. 430/287.1, 281.1, 430/905, 909, 325, 23, 26, 28, 29; 525/58, 61, 59, 330.6, 315, 307.5

[56] References Cited

U.S. PATENT DOCUMENTS 4,564,580  1/1986  Ichimura et al. ............. 430/287.1

FOREIGN PATENT DOCUMENTS

| | | |
|---|---|---|
| 565761 | 3/1967 | Japan . |
| 5917550 | 10/1976 | Japan . |
| 2118575 | 3/1979 | Japan . |
| 2276806 | 6/1979 | Japan . |
| 565762 | 7/1979 | Japan . |
| 5611906 | 11/1980 | Japan . |
| 5523163 | 9/1981 | Japan . |
| 5562905 | 6/1983 | Japan . |
| 2160807 | 4/1985 | Japan . |
| 643645 | 2/1988 | Japan . |

Primary Examiner—Janet Baxter
Assistant Examiner—Sin J. Lee
Attorney, Agent, or Firm—Huntley & Associates

[57] ABSTRACT

The invention provides a photosensitive resin and a photosensitive resin composition having excellent water resistance after hardening, excellent developability, and excellent patterning characteristics, and a pattern formation method making use of the composition. The invention provides saponified PVA photosensitive resin which contains structural units represented by formulas (I) and (II):

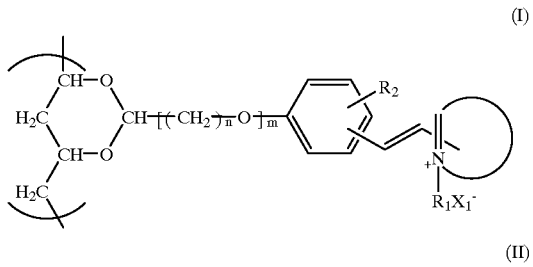

(I)

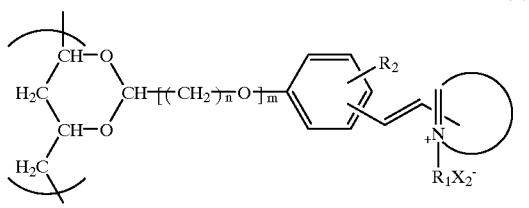

(II)

the content of the structural units represented by formulas (I) and (II) in the resin being 0.5–10 mol % with respect to entirety of the structural units of the saponified product of PVA.

7 Claims, No Drawings

PHOTOSENSITIVE RESIN AND COMPOSITION THEREOF DERIVED FROM SAPONIFIED POLY(VINYL ACETATE) AND PATTERN FORMATION METHOD

BACKGROUND OF THE INVENTION

1. Field of the Invention

The present invention relates to a photosensitive resin derived from saponified poly(vinyl acetate), a photosensitive resin composition containing the resin, and a pattern formation method making use of the composition, and more particularly, to such a resin and resin composition which can be developed with an aqueous developer and which, when hardened, exhibits excellent water resistance and patterning characteristics, and to a pattern formation method making use of the composition.

2. Background Art

Conventional water-soluble photosensitive resins which are derived from saponified poly(vinyl acetate) (hereinafter referred to as "saponified PVA photosensitive resins") include those having a pendant group derived from a styryl derivative having a quaternary aromatic nitrogen-containing heterocyclic ring and are disclosed in, for example, Japanese Patent Publication (kokoku) Nos. 56-5761, 56-5762, and 2-276806 and Japanese Patent Application Laid-Open (kokai) Nos. 56-11906, 59-17550, 2-118575, and 6-43645. Although these photosensitive resins have high photosensitivity, hardened products thereof have poor water resistance and swell during development and thereby provide insufficient resolution in pattern formation.

Japanese Patent Application Laid-Open (kokai) No. 2-160807 discloses a saponified poly(vinyl acetate), as a saponified PVA photosensitive resin, containing a pendant group derived from a styryl derivative having a quaternary aromatic nitrogen-containing heterocyclic ring which pendant group has a betaine structure. However, this photosensitive resin has drawbacks, such as relatively poor photosensitivity and poor developability attributed to low water-solubility. As described above, conventional saponified PVA photosensitive resins have drawbacks such as poor water resistance when they become hardened, poor heat resistance, insufficient water solubility, and poor developability.

SUMMARY OF THE INVENTION

The present invention provides photosensitive resins having excellent water resistance after hardening, excellent developability, and excellent patterning characteristics. The present invention also provides photosensitive resin compositions containing these resins. The present invention further provides pattern formation methods making use of the compositions. The present invention is based on the finding that a saponified PVA polymer compound contains a predetermined content (by mol) of a pendant group formed of a styryl compound having a quaternary aromatic nitrogen-containing heterocyclic ring in which a fraction of anion moieties is converted to an anion moiety derived from a polybasic acid having a $pK_1$ of 3.5 or less which polybasic acid has two or more proton-releasing groups.

Accordingly, in a first aspect of the present invention, there is provided a saponified PVA photosensitive resin which contains structural units represented by formulas (I) and (II):

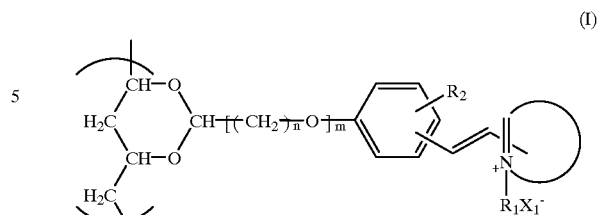

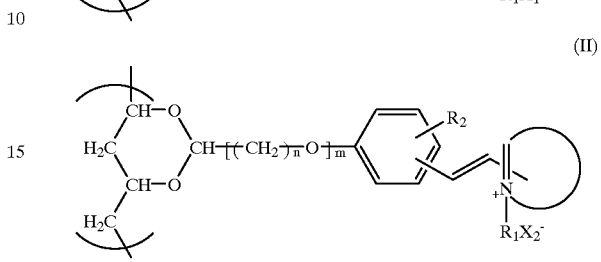

wherein $R_1$ represents an alkyl group, an aralkyl group, or lower alkoxycarbonyl group, any of which groups can have a hydroxyl group, a carbamoyl group, an ether linkage or an unsaturated group; $R_2$ represents a hydrogen atom or a lower alkoxy group; m is 0 or 1; n is an integer between 1 and 6 inclusive; a moiety represented by the following formula:

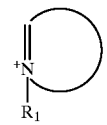

which represents a cationic portion of a quaternary aromatic azoheterocyclic group, $X_1^-$ represents an anion derived from polybasic acid having a $pK_1$ of 3.5 or less which polybasic acid has two or more proton-releasing groups; and $X_2^-$ represents an anion other than $X_1^-$, the content of the structural units represented by formulas (I) and (II) in the resin being 0.5–10 mol % with respect to the entirety of the structural units of the saponified product of PVA.

In the context of the present invention, alkyl is a moiety having from 1 to 10 carbon atoms, and preferably from 1 to 6 carbon atoms. Aralkyl is a moiety having from 7 to 12 carbon atoms, and preferably from 7 to 9 carbon atoms. Lower alkoxycarbonyl is a moiety having from 3 to 12 carbon atoms and preferably from 3 to 7 carbon atoms. Lower alkoxy is a moiety having from 1 to 6 carbon atoms, and preferably from 1 to 3 carbon atoms In the first aspect of the present invention, the mol ratio of the structural unit represented by (I) to that represented by (II) is preferably 0.05 or more.

In the second aspect of the present invention, there is provided a photosensitive resin composition containing the photosensitive resin according to the first aspect.

In the third aspect of the present invention, there is provided a pattern formation method comprising the steps of applying the photosensitive resin composition according to the second aspect of the present invention to a substrate so as to form a layer of the photosensitive resin; exposing the layer patternwise; and developing the resulting pattern.

Preferably, the above-described substrate serves as an inner surface of a face plate of a color cathode-ray tube.

In an especially preferred embodiment of the present invention, a black matrix is formed on the above-described substrate and a phosphor pattern is formed by use of the above-described photosensitive resin composition incorporating a phosphor.

DETAILED DESCRIPTION OF PREFERRED EMBODIMENTS

The novel saponified PVA photosensitive resin of the present invention has excellent water resistance after hardening, excellent photosensitivity, and excellent resolution.

Particularly, a saponified PVA photosensitive resin having a mol ratio of the structural unit represented by formula (I) to that represented by formula (II) of at least about 0.05 has excellent water resistance after hardening, excellent photosensitivity, and excellent resolution. When the ratio is less than about 0.05, these properties are depreciated.

The anions represented by $X_1^-$ and $X_2^-$ in formulas (I) and (II) can be provided from a variety of sources. Examples of the sources include a catalyst and a raw material for synthesizing the photosensitive resin, and a post-synthesis additive. In any case no particular limitation is imposed on $X_1^-$ so long as a polybasic anion having a $pK_1$ of 3.5 or less which polybasic acid has two or more proton-releasing groups serves as $X_1^-$.

The saponified PVA polymer compound serving as the photosensitive resin of the present invention can be easily obtained through reaction of saponified PVA or an aqueous copolymer of vinyl alcohol and another vinyl compound with an aldehyde compound represented by the following formula (III):

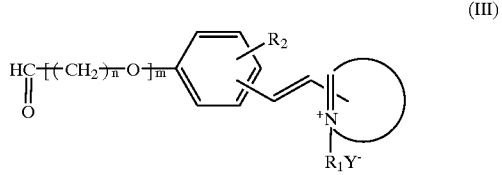

(III)

or with an acetal compound represented by the following formula (IV)

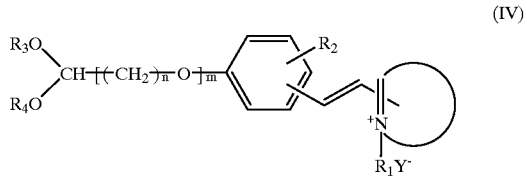

(IV)

wherein $Y^-$ represents an anion such as chloride, bromide, iodide, monoalkylsulfate, or p-toulenesulfonate; $R_1$ has the same meaning as described above; $R_2$ has the same meaning as described above; each of $R_3$ and $R_4$ represents a lower alkyl group; $R_3$ and $R_4$ can be bound to form an alkylene group; m is 0 or 1; n is an integer between 1 and 6 inclusive; and a moiety represented by the following formula:

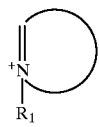

which represents a cationic portion of a quaternary aromatic azo-heterocyclic group.

Examples of the cationic portion of a quaternary aromatic azo-heterocyclic residue include those represented by the following formulas:

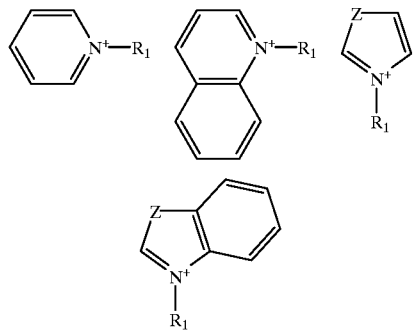

wherein $R_1$ represents an alkyl group, an aralkyl group, or a lower alkoxycarbonylalkyl group; Z represents O, S, Se, or $NR_5$; and $R_5$ represents a lower alkyl group.

In order to synthesize a saponified PVA polymer compound serving as the photosensitive resin of the present invention, a polybasic acid having a $pK_1$ of 3.5 or less, which polybasic acid has two or more proton-releasing groups, is used as an acid catalyst in synthetic reaction. No particular limitation is imposed on the polybasic acid which can be used in the present invention so long as the acid has a $pK_1$ of 3.5 or less. Examples of the polybasic acids which can be used include oxalic acid, tartaric acid, dihydroxytartaric acid, maleic acid, iminodiacetic acid, and nitrilotriacetic acid. In addition, customary acid catalysts such as phosphoric acid, hydrochloric acid, sulfuric acid, p-toluenesulfonic acid, methanesulfonic acid, and an acidic ion-exchange resin be used alone or in combination.

Employment of such polybasic acids as an acid catalyst renders $X_1^-$ an anion derived from the polybasic acid. In this case, $X_1^-$ is the above-described $Y^-$ in formulas (III) and (IV); or an anion derived from an acid catalyst other than $X_1^-$.

The above-described acid catalyst is used in such an amount that the pH of the reaction system is 3 or less where reaction of compounds represented by formulas (III) and (IV); i.e., acetalization, can occur and such that the mol ratio of the structural unit represented by formula (I) to that represented by formula (II) is 0.05 or more. When the $pK_1$ of a polybasic acid catalyst is above 3.5, a large amount of the catalyst is required for adjusting the pH to 3 or less where reaction of compounds represented by formulas (III) and (IV); i.e., acetalization, can occur, and the formed photosensitive resin has poor characteristics.

The above reaction is performed in an aqueous medium, preferably in water. A wide range of reaction conditions can be used. Typically, the reaction can be performed in a temperature range from room temperature to 100° C. for 2–72 hours.

After the reaction is completed, the resultant reaction mixture is poured into a large amount of a poor solvent for the target polymer such as acetone, ethanol, or dioxane to thereby precipitate the polymer. The polymer is isolated, washed with methanol or the like, and dried to thereby obtain a saponified PVA polymer of the present invention. Alternatively, the resultant reaction mixture can be neutralized with an aqueous solution of an alkali (such as sodium hydroxide or potassium hydroxide) or aqueous ammonia or is neutralized with a basic ion-exchange resin. The ion-exchange resin is then removed by filtration, to thereby obtain an aqueous solution of a target polymer.

The saponified PVA used as a starting compound of the above reaction has an average degree of polymerization of about 200–5000 and a degree saponification of about 60–100%, and preferably 3000 and 70–99%, respectively.

When the average degree of polymerization is lower than about 200, the formed resin has poor photosensitivity, whereas when it is in excess of about 5000, the resultant photosensitive resin composition provides excessively high viscosity to a coating solution, and the coatability of the solution and the water developability of the composition are disadvantageously deteriorated. Thus, the average polymerization degree is about 200–5000.

The degree of saponification is about 60–100%. When the Saponification degree is lower than 60%, the water-solubility of the formed resin and the water-developability of the composition are insufficient.

A modified saponified PVA can also be used as the saponified PVA used as a starting compound of the above reaction. Examples of the modified products include saponified PVA modified with a reactive group such as a hydrophilic group, an oleophilic group, an anion, a cation, or an acetoacetyl group.

When such saponified PVAs, the above-described compound represented by formula (III) and/or an acetal thereof, and the above-described compound represented by (IV) are reacted in the presence of an acid catalyst, additional aldehydes or acetals thereof are simultaneously reacted. Examples of the aldehydes include formaldehyde, acetoaldehyde, propionaldehyde, butylaldehyde, benzaldehyde, hydroxybenzaldehyde, o-benzaldehyde sulfonic acid or salts thereof, and benzaldehyde-2,4-disulfonic acid or salts thereof.

The above-described compound represented by formula (III) and/or an acetal thereof is incorporated into the saponified PVAs in an amount of about 0.5–10 mol % with respect to the entirety of the monomer units, preferably 0.8–7 mol %. When the ratio is less than about 0.5 mol %, the photosensitivity of the obtained resin is disadvantageously low for practical use, whereas when it is in excess of about 10 mol %, the water-solubility the obtained resin is insufficient. Thus, the incorporation ratio is about 0.5–10 mol %. In general, when the saponified PVAs which can be employed in the present invention have a low polymerization degree, the above incorporation ratio must be increased in order to realize a resin of sufficient photosensitivity, whereas when the polymerization degree is high, even a low incorporation ratio can realize a resin of sufficient photosensitivity.

A wide variety of conditions can be used in the process for producing the photosensitive resin of the present invention. Moreover, the method for incorporating an anion derived from a polybasic acid is not limited to the above-described method in which a polybasic acid serves as an acid catalyst. Briefly, the above-described polybasic acids can be added after synthesis of the modified resin, in the presence of an acid catalyst such as phosphoric acid, to thereby incorporate on anion derived from the polybasic acids. In this alternative method, the effect of the present invention is not as strong as the case in which a polybasic acid serves as an acid catalyst. However, the effect in the alternative method is surprisingly good as compared with the conventional case in which no polybasic acid is added. Of course, a method can be used in which a polybasic acid is used as an acid catalyst, and a polybasic acid is further added after synthesis of the modified resin.

The photosensitive resin compositions of the present invention can be prepared by addition of additives into the photosensitive resin of the present invention in accordance with needs, and dissolving or dispersing the mixture in a water-base solvent. Although water is typically used as the solvent, an additional water-soluble solvent can be added in an amount of 50 wt. % or less. Examples of the additional solvents include water-soluble solvents such as methyl alcohol, ethyl alcohol, isopropyl alcohol, acetone, tetrahydrofuran, dioxane, dimethylformamide, and N-mehylopyrrolidinone; ethylene glycol monomethyl ether; and ethylene glycol monoethyl ether.

When the photosensitive resin composition of the present invention further contains at least one species of a photopolymerizable unsaturated compound and a photopolymerization initiator system, the characteristics of the composition can be even more enhanced.

The above-described photopolymerizable unsaturated compound can be hydrophobic or hydrophilic, and examples of the compounds include unsaturated monomers or prepolymers having at least one polymerizable unsaturated group such as acoryl group, a methacryl group, an allyl group, a vinyl ether group, a vinyl group, or an acrylamide group.

The photopolymerization initiator system used can vary widely, so long as the system generates radicals serving as photopolymerization-activators through light exposure. Examples include α-homolysis initiators such as benzoin ether, hydroxyalkyl ketone, dialkoxyacetophanone, benzoylphosphine oxide, and benzoinoxime ketone; aromatic ketones such as benzophonone, benzyl, thioxanthone, and ketocoumarin; systems of these ketones and hydrogen-donors such as amines; organic peroxides; onium salts; systems of triphenylalkyl borate or an iron-arene complex and electron-donors such as thioxanthene dyes and α-ketocoumarin; systems including N-arylglycine and an electron acceptor; and polyhalogen compounds.

Generally, a thermal polymerization inhibitor is preferably added to the above photopolymerization systems.

In addition to the above-described components, the photosensitive resins composition containing the photosensitive resin of the present invention can contain other additives such as nonionic hydrophobic polymer emulsions, surfactants, dyes, pigments, inorganic filers, emulsion-stabilizers, plasticizers plasticizers, leveling agents, silane-coupling agents, and defoaming agents. Although nonionic surfactants are preferred as the surfactants, anionic surfactants can also be used. In order to form phosphor patterns, a variety of phosphors can be added to the composition, whereas a light-absorbing substance such as an organic or an inorganic black pigment can be added in order to form a black matrix.

The thus obtained saponified PVA photosenstive resins of the present invention and the compositions containing the same are applied to a variety of substrates such as metal plates; e.g., aluminum and stainless steel; screen mesh; paper; glass plates; or semiconductor substrates. The coated substrates are dried so as to have a coating thickness of, e.g., about 0.5–1000 µm.

The above coating film is irradiated with UV rays; e.g., active rays having a wavelength of about 300–500 µm, to thereby harden the light-exposed portion. Thereafter, the nonexposed portion is removed by a coating-remover, such as water, to thereby obtain a pattern image. The thus-processed coating film can be applied to screen printing plates, formation of black matrices or phosphor patterns of a color cathode-ray tube, color filters of CCD and LCD, color proofs to printing, and etching resists.

Particularly, when the saponified PVA photosensitive resins of the present invention and the compositions containing the same are applied to phosphor patterning in a color cathode-ray tube, the resolution and adhesion of the phosphor pattern are excellent as compared with similar resins and compositions of conventional art. In addition, since the resins and the compositions of the present invention omit use of a high-resolution photosensitive resin composition containing a bichromate salt, chromium-free application is easy to realize.

EXAMPLES

The present invention is further illustrated by the following Examples and Comparative Examples.

Synthesis Example

A saponified PVA (hereafter simply referred to as PVA; GH-17, a product of The Nippon Synthetic Chemical Industry Co., Ltd.; polymerization degree 1700; saponification degree 88%) (100 g) was dissolved in pure water (900 g), to thereby form a solution. N-methyl-4-formylstrylpyridinium metosulfate (hereinafter referred to as SbQ(MeS) (9.90 g, 1.45 mol % with respect to the entirety of the structural units of PVA) and oxalic acid dihydrate (4g) were dissolved in the solution, and the resultant solution was stirred at 30° C. for 20 hours. Amberlite IR-45 (ion exchange resin, product of Rohm & Haas Co.) (30 g) was added to the reaction mixture, and the resultant mixture was further stirred for two hours. When the pH of the mixture was confirmed to be neutral, Amberlite IR-45 was removed through filtration by use of 400-mesh plain gauze, to thereby obtain a pale yellow aqueous solution of a polymer.

The ratio of SbQ-pendant units to the entirety of the structural units as obtained through UV spectrometry was 1.30 mol %. The mol ratio of COOH—COO— to $CH_3SO_4^-$ derived from SbQ(MeS) as obtained through ion chromatographic analysis was 18/82.

Comparative Synthesis Example

PVA (GM-17, product of The Nippon Synthetic Chemical Industry Co., Ltd.; polymerization degree 1700; saponification degree 88°) (100 g) was dissolved in pure water (900 g), to thereby form a solution. SbQ(MeS) (9.90 1.45 mol % with respect to the entirety of the structural units of PVA) and phosphoric acid (2.5 g) were dissolved in the solution, and the resultant solution was stirred at 30° C. for 20 hours. Amberlite IR-45 (ion-exchange resin, product of Rohm & Haas Co.) (20 g) was added to the reaction mixture, and the resultant mixture was further stirred for two hours. When the pH of the mixture was confirmed to be neutral, Amberlite IR-45 was removed through filtration by use of 400 mesh plain gauze, to thereby obtain a pale yellow aqueous solution of a polymer.

The ratio of SbQ-pendant units to the entirety of the structural units as obtained through UV spectrometry was 1.30 mol %. The mol ratio of $H_2PO_4^-$ to $CH_3SO_4^-$ derived from SbQ(MeS) as obtained through ion chromatographic analysis was 37/63.

Example 1

| Formulation of a photosensitive composition | |
|---|---|
| 6 wt. % aqueous solution of the photosensitive polymer produced in the above Synthetic Example: | 20 g |
| Acryl emulsion (AC-140, product of Toyo Gosei Kogyo, solid content 40%): | 1.5 g |

The photosensitive composition having the above formulation was applied to a glass plate so as to attain a thickness after drying of 5.0 μm, to thereby obtain a test plate. The coating was exposed for 30 seconds to light of an ultra-high pressure mercury lamp having an illuminance of 5.0 mW/cm$^2$) at 350. Subsequently, the test plate was soaked in pure water for one minute. Residual water on the coating surface was removed through air-blowing.

The swelling ratio of the coating film was evaluated based on the equation: $(W_2/W_1) \times 100$, wherein $W_1$ represents (the weight of the test plate after coating)−(the weight of the glass plate) and $W_2$ represents (the weight of the test plate after air-blowing)−(the weight of the glass plate). The swelling ratio was found to be 235%.

Comparative Example 1

A similar test was carried out on the photosensitive produced in the Comparative Synthetic Example, and swelling ratio was found to be 255%.

Comparative Example 2

A glass substrate on which a black matrix had been formed through a customary method was precoated with a 0.1% solution, PVA solution which was then dried. A phosphor slurry having the following composition was applied and dried, to thereby obtain a coating film having a thickness of 12–13 μm. A phosphor pattern was then formed under the below-described conditions

| Composition of the phosphor slurry | |
|---|---|
| Green phosphor (average grain size of 6.5 μm): | 50 g |
| Pure water: | 56.7 g |
| 6 wt. % Aqueous solution containing a photosensitive polymer of the Comparative Synthesis Example: | 45.67 |
| 10 wt. % nonionic surface active agent commercially available from BASF Co. as "L-62" | 0.9 g |
| Conditions for pattern formation: | |
| Shadowmask: | pitch 0.25 mm |
| Shadowmask-glass substrate distance: | 9 mm |
| Light source-shadowmask distance: | 270 mm |
| Light source: Ultra-high pressure mercury lamp | |
| Development by hot water spraying | |

The obtained phosphor pattern exhibited low adhesion to the substrate and yielded considerable peeled portions, even in the case of a pattern having a diameter of 150 μm or more. The resolution of the pattern having a diameter of 150 μm was poor accompanied by many fringes.

Example 2

The procedure of Comparative Example 2 was repeated, except that a phosphor slurry having the following composition was applied and dried, to thereby obtain a coating film having a thickness of 12–13 μm. A phosphor pattern was then 10 formed under the conditions of Comparative Example 2.

| Composition of the phosphor slurry | |
|---|---|
| Green phosphor (average grain size of 6.5 μm): | 50 g |
| Pure Water: | 56.7 g |
| 6 wt. % Aqueous solution containing a photosensitive wt. polymer of the Synthesis Example 10 wt. % L-62 (BASF Co.): | 0.9 g |

The obtained phosphor pattern completely adhered to the substrate even in the case of a pattern having a diameter of 145 μm or more. The resolution of the pattern having a diameter of 150 μm was excellent and accompanied by less fringes as compared with the case of Comparative Example 1.

Example 3

The procedure of Comparative Example 2 was repeated, except that a phosphor slurry having the following composition was applied and dried, to thereby obtain a coating film having a thickness of 12–13 μm. A phosphor pattern was then formed under the conditions of Comparative Example 2.
Composition of the phosphor slurry obtain a coating film having a thickness of 12–13 μm. A phosphor pattern was then formed under the conditions of Comparative Example 2.

| Composition of the phosphor slurry | |
|---|---|
| Green phosphor (average grain size of 6.5 μm): | 50 g |
| Pure water: | 55.9 g |
| 6 wt. % Aqueous solution containing a photosensitive polymer of Comparative Synthesis Example.: | 45.67 |
| 10 wt. % Aqueous solution containing oxalic acid.: | 0.86 g |
| 10 wt. % L-62 (BASF Co.): | 0.9 g |

The obtained phosphor pattern completely adhered to the substrate, even in the case of a pattern having a diameter of 135 μm or more. The resolution of the pattern having a diameter of 150 μm was excellent; the same as that obtained use of a conventional PVA-ADC (ammonium dichromate) and the pattern was accompanied by substantially no fringes.

Example 4

The procedure of Comparative Example 2 was repeated, except that a phosphor slurry having the following composition was applied and dried, to thereby obtain a coating film having a thickness of 12–13 μm. A phosphor pattern was then formed under the conditions of Comparative Example 2.

| Composition of the phosphor slurry | |
|---|---|
| Green phosphor (average grain size of 6.5 μm): | 50 |
| Pure water: | 55.9 g |
| 6 wt. % Aqueous solution containing a photosensitive polymer of the Comparative Synthesis Example: | 45.67 g |
| 10 wt. % Aqueous solution containing oxalic acid: | 0.86 g |
| 10 wt. % L-62 (BASF Co.): | 0.9 g |

The obtained phosphor pattern completely adhered to the substrate, even in the case of a pattern having a diameter of 145 μm or more. The resolution of the pattern having a diameter of 150 μm was excellent and accompanied by less fringes as compared with the case of Comparative Example 1.

As described hereinabove, the present invention provides a photosensitive resin and a photosensitive resin composition having excellent water resistance after hardening, excellent developability, and excellent patterning characteristics, and a pattern formation method making use of composition.

What is claimed is:

1. A saponified poly(vinyl acetate) photosensitive resin which contains structural units represented by formulas (I) and (II)

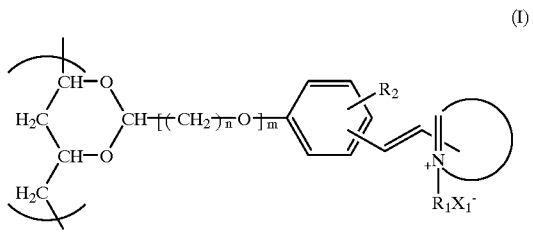

(I)

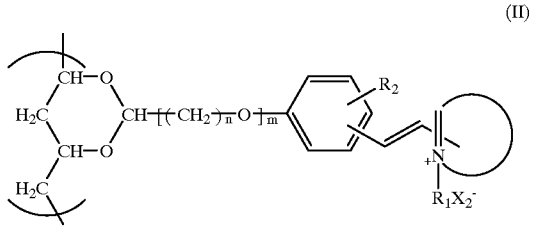

(II)

wherein $R_1$ represents an alkyl group, an aralkyl group, or a lower alkoxycarbonyl group, any of which groups can have a hydroxyl group, a carbamoyl group, an ether linkage, or an unsaturated group; $R_2$ represents a hydrogen atom or a lower alkoxy group; m is 0 or 1; n is an integer between 1 and 6 inclusive; a moiety represented by the following formula:

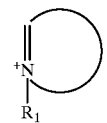

which represents a cationic portion of a quaternary aromatic azo-heterocyclic group; $X_1^-$ represents an anion derived from an organic polybasic acid having a $pK_1$ of 3.5 or less which organic polybasic acid is selected from the group consisting of oxalic acid, tartaric acid, dihydroxytartaric acid, maleic acid, iminodiacetic acid, and nitrilotriacetic acid; and $X_2^-$ represents an anion other than $X_1^-$, the content of the structural units represented by formulas (I) and (II) in the resin being about 0.5–10 mol % with respect to the entirety of the structural units of the saponified product of PVA.

2. A saponified poly(vinyl acetate) photosensitive resin according to claim 1 wherein the mol ratio of the structural unit represented by (I) to that represented by (II) is at least about 0.05.

3. A photosensitive resin composition comprising a photosensitive resin as described in claim 1 and a water based solvent capable of dissolving or dispersing the photosensitive resin.

4. A photosensitive resin composition comprising a photosensitive resin as described in claim 2 and a water base solvent capable of dissolving or dispersing the photosensitive resin.

5. A pattern formation method comprising the steps of applying the photosensitive resin composition of claim 3 to a substrate so as to form a layer of the photosensitive resin; exposing the layer patternwise; and developing the resulting pattern.

6. A pattern formation method according to claim 5, wherein the substrate serves as an inner surface of a faceplate of a color cathode-ray tube.

7. A pattern formation method according to claim 6 wherein a black matrix is formed on the substrate, and a phosphor pattern is formed by use of the photosensitive resin composition incorporating a phosphor.

* * * * *